(12) United States Patent
Yachareni et al.

(10) Patent No.: US 6,370,061 B1
(45) Date of Patent: Apr. 9, 2002

(54) CEILING TEST MODE TO CHARACTERIZE THE THRESHOLD VOLTAGE DISTRIBUTION OF OVER PROGRAMMED MEMORY CELLS

(75) Inventors: Santosh K. Yachareni, Santa Clara; Kazuhiro Kurihara, Sunnyvale; Binh Q. Le; Michael S. C. Chung, both of San Jose, all of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/884,583

(22) Filed: Jun. 19, 2001

(51) Int. Cl.[7] .............................................. G11C 16/34
(52) U.S. Cl. ........................... 365/185.22; 365/185.03; 365/185.09; 365/185.2; 365/189.07; 365/189.09
(58) Field of Search ......................... 365/185.22, 185.2, 365/185.03, 185.09, 189.09, 189.07, 185.33

(56) References Cited

U.S. PATENT DOCUMENTS

| | | | |
|---|---|---|---|
| 5,386,388 A | 1/1995 | Atwood et al. ............. | 365/201 |
| 5,600,593 A | 2/1997 | Fong ..................... | 365/185.19 |
| 5,764,568 A | 6/1998 | Chevallier ............. | 365/185.03 |
| 5,886,926 A * | 3/1999 | Marquot ................. | 365/185.21 |
| 5,956,283 A | 9/1999 | Park ........................... | 365/226 |
| 6,112,314 A | 8/2000 | Norman et al. ................ | 714/37 |
| 6,163,479 A | 12/2000 | Chevallier ............. | 365/185.03 |
| 6,285,594 B1 * | 9/2001 | Bill et al. .............. | 365/185.23 |
| 6,285,599 B1 * | 9/2001 | Shimada et al. ........ | 365/185.29 |

* cited by examiner

Primary Examiner—Andrew Q. Tran
(74) Attorney, Agent, or Firm—Eschweiler & Associates, LLC

(57) ABSTRACT

The present invention relates to flash memory systems and methods to determine the threshold voltage of core cells. In one exemplary system, there is provided a method of characterizing the high end of the threshold voltage distribution of an array of programmed cells. In accordance with the invention, an exemplary system and method are presented to apply a varying characterization signal operably through a high breakdown voltage periphery donut transistor and wordline drive transistors, which are driven into saturation by a boosted gate voltage which is higher than the applied varying characterization signal, in a manner which provides for the accurate determination of the $V_T$ of the core cells, through the comparison of the conduction in a reference cell to that of the conduction in a core cell produced by a varying characterization signal applied to the core cell gate.

17 Claims, 8 Drawing Sheets

CEILING TEST MODE TO CHARACTERIZE THE THRESHOLD VOLTAGE DISTRIBUTION OF OVER PROGRAMMED MEMORY CELLS

FIELD OF INVENTION

The present invention relates generally to memory systems and in particular, to flash memory array systems and methods for determining the threshold voltage of a core cell, wherein a newly applied reference cell structure, a new external signal bias structure, and the application of an external characterization signal during program read verify operations, enables a measurement of the actual core cell threshold voltage.

BACKGROUND OF THE INVENTION

Flash memory is a type of electronic memory media which can be rewritten and hold its data without power applied thereto.

In flash cells, programming is carried out by applying appropriate voltages to the source, drain, and control gate of the device for an appropriate time period. This causes electrons to tunnel or be injected from a channel region to a stacked gate. The amount of charge residing on the stacked gate determines the voltage required on the control gate to cause the device to conduct current between the source and drain regions. This voltage is termed the threshold voltage, $V_T$, of the cell. Conduction represents an "on" or erased state of the device and corresponds to a logic value of one. An "off" or programmed state is one in which current is not conducted between the source and drain regions and corresponds to a logic value of zero. By setting the threshold voltage of the cell to an appropriate value, the cell can be made to either conduct or not conduct current for a given set of applied voltages. Thus, by determining whether a cell conducts current at the given set of applied voltages, the state of the cell (programmed or erased) can be determined.

In a prior art flash memory device, such as the stacked gate array, a cell is programmed by applying the programming voltages for some period of time in the form of a programming pulse, and over programming the memory cells was not a significant problem. Even though write program pulses were relatively long, this did not change the cell threshold voltage substantially for a given pulse width. With the newer dual bit memory cells, however, even a narrow 1 microsecond program pulse can easily over program the cells to an undesirably high $V_T$ level.

When reading the state of the memory cell, the threshold voltage value or range of values for which the memory cell conducts current (as determined by comparison with a sense amplifier having a preselected reference value) corresponds to a binary decoded value representing the programmed data. The threshold voltage level for which the cell conducts thus corresponds to a bit set representing the data programmed into the cell.

In the prior art, threshold voltage determinations after erasure or programming were limited to the determination that the actual threshold voltage was either somewhere above or below an erase verify reference voltage, or a program verify reference voltage respectively. The measurement of this true threshold voltage was not readily obtained.

In order to measure these higher over programmed cell threshold voltages or verify the program condition of the cells, a second problem surfaced in the hardware, wherein an even higher voltage was required on the gate of the transistors which feed the wordline voltage to the array. This wordline driver voltage has to be greater than the core cell $V_T$ voltage plus the over drive to verify at a sufficient current range. Given the relatively low wordline drive voltages of the prior art, and some of the high $V_T$'s over programmed dual bit cells, the $V_T$'s of some of the over-programmed cells could not be determined. With the substantial voltage drop in the n-channel pass gate wordline drive voltage, there is yet another problem in distinguishing between the over programmed high cell $V_T$, and the high voltage drops within the chain of selection transistors leading to the wordline of the core cell. This blurred distinction between high $V_T$ and high voltage drops, creates additional uncertainties in the $V_T$ determinations. Thus, there is also a need for a higher voltage wordline drive voltage, and/or some other means to reduce the voltage drops thru the wordline drive transistors.

It is necessary to be able to program multiple bits (and as a result, multiple memory cells) at the same time in order to produce a commercially desirable memory system which can be programmed within a reasonable amount of time. However, a problem arises when a number of bits are to be programmed at the same time. This is because the characteristics of each bit are different (due to minor variations in the structure and operation of the semiconductor devices which comprise the memory cells), so that variations in the programming speed of different cells will typically occur. This results in bits that become programmed faster than others, (the cell will be programmed to a different threshold voltage level.

As noted, fast programming of multiple memory cells can result in undershooting or overshooting the desired threshold voltage level of some cells, potentially producing an error in subsequently reading the data being stored. In mass storage systems where programming speed is a key performance criteria and lengthy re-programming and erase operations are not desirable, a method for precisely measuring, and/or handling cell threshold voltage characteristics while still in the manufacturing facility before further programming or erase operations by the end user, would be more efficient. What is desired is a method of characterizing the threshold voltages in a multistate memory cell in order to properly and efficiently program the cell, as well as to provide a means of feedback control and correction of the over programmed cells yielding a tighter $V_T$ distribution.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its sole purpose is to present some concepts of the invention in a simplified form as a prelude to the more detailed description that is presented later.

The present invention relates to flash memory systems and methods to determine the threshold voltage of core cells. In one exemplary system, there is provided a method of characterizing the high end of the threshold voltage distribution of an array of programmed cells. During verify operations of this exemplary method, an external characterization signal (e.g., a varying core cell characterization signal, staircase, or ramp waveform) is operationally applied to the Wordline, and incrementally changed until a selected, programmed memory cell drain current conduction matches that of a reference cell, and a read sense amplifier comparator changes state in response thereto.

In accordance with another aspect of the invention, there is provided a method of determining the core cell threshold voltage for one or more cells of the array, thereby providing: a $V_T$ distribution characterization map of the array for development purposes. In addition, such a characterization map may be employed to generate faster programming times, provide feedback control and correction of the over programmed cells to be in a tighter distribution range of around 4–5 volts, and/or reduce the number of over programmed cells.

One aspect of the invention uses a high breakdown voltage transistor along with some boost driver transistors to conduct a characterization reference signal to the wordline of the core cells. In addition, the application of a charge pump voltage drives the gates of the high breakdown voltage transistor and driver transistors into saturation, and permits full substantial conduction therethrough of the characterization signal to the wordline. Therefore the present invention prevents any appreciable voltage drops associated with such wordline drive circuitry, which heretofore caused excessive uncertainty in the core cell $V_T$ determinations. As a characterization signal is applied to the gate of the core cell, and varies with a voltage which is known, a comparison of the corresponding core cell conduction to a known reference cell conduction provides a relatively accurate determination as to the threshold voltage of the over programmed cells.

As discussed, a high charge pump voltage applied to the gates of the high breakdown voltage transistor and wordline drive circuitry has particular significance when measuring the over programmed core cells, where the $V_T$'s are the highest. This is due to the fact that the gate voltage of the high breakdown voltage transistor and wordline drive transistors should be about 3 to 4 volts higher than the applied characterization signal (e.g., up to about 10 volts) to ensure full conduction at all applied signal voltages.

Even though according to one exemplary aspect of the present invention the focus of the inventors is to address the over programmed core cells, it will become immediately obvious to those familiar with the art that this method may also be applied to the determination of all levels of the threshold voltage of core cells by starting the characterization signal at a lower voltage.

Still another exemplary aspect of the invention may use the result of the individual core cell threshold voltage determination, or the complete array threshold voltage characterization within a new control circuit to provide feedback control of the program, read, erase, soft program, operations or related verify operations.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
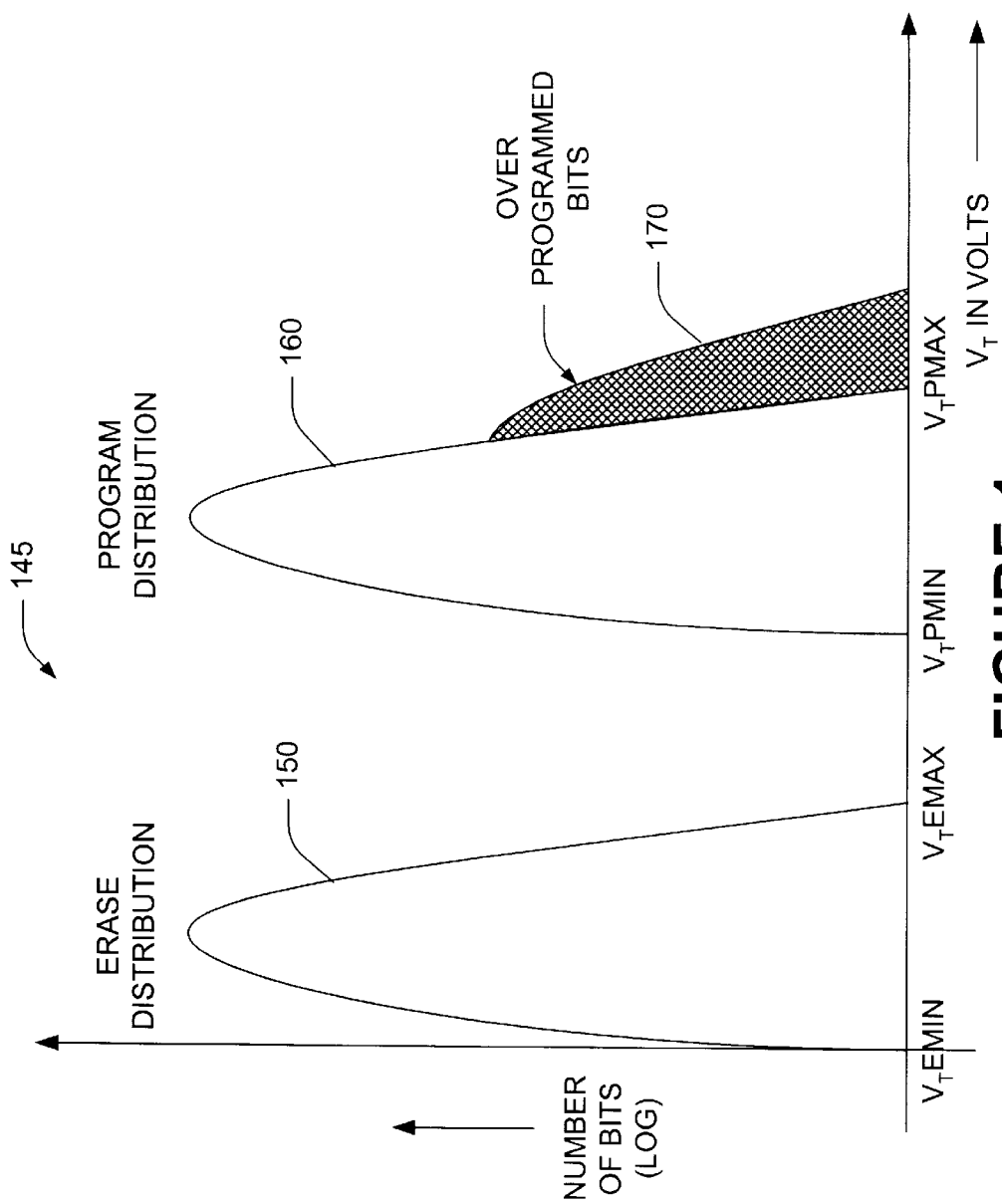
FIG. 1 is a distribution plot illustrating an erased cell threshold voltage distribution and a programmed cell threshold voltage distribution of a number of core cells of an exemplary prior art flash memory array, together with over programmed bits.

The present invention will now be described with reference to the drawings, wherein like reference numerals are used to refer to like elements throughout. The present invention relates to a system and method of characterizing the high end of the threshold voltage distribution of an array of programmed cells in a flash memory.

FIG. 1 illustrates a distribution plot 145 of a population of erased core cell threshold voltages 150 and of programmed core cell threshold voltages 160, together with over programmed bits 170, of an exemplary prior art flash memory array. Together, these distributions form what may be called a characterization map 145 of the $V_T$'s of the array of core cells. Each of the distribution populations has a threshold voltage minimum ($V_T$EMIN, $V_T$PMIN) and a maximum ($V_T$EMAX, $V_T$PMAX), respectively. The over programmed bits 170 are a result of applying the programming voltage for a longer time than necessary, either in a single programming pulse, or multiple pulses. As illustrated in FIG. 1, the over programmed bits 170 exhibit a substantially large threshold voltage.

Figure 2:
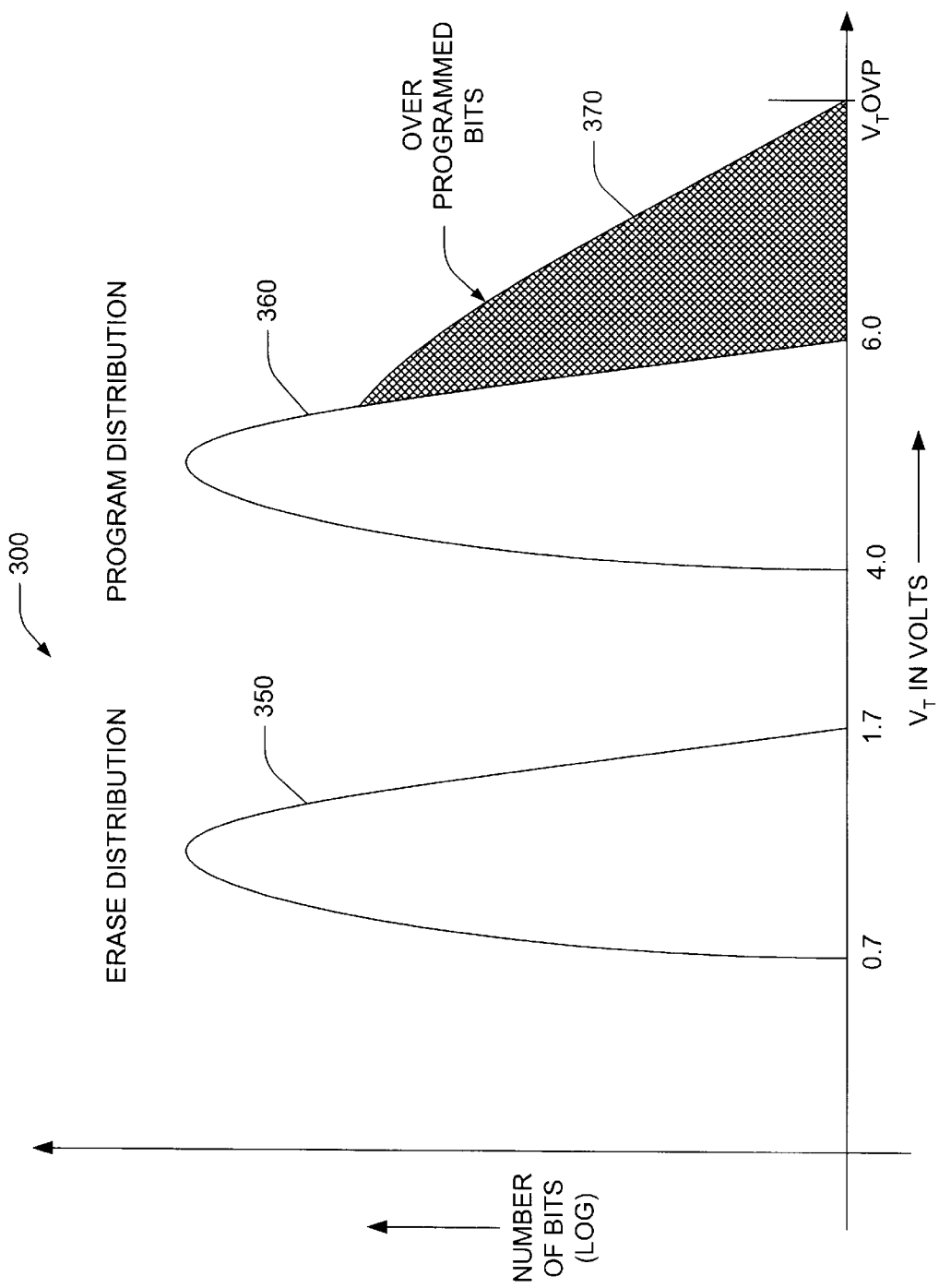
FIG. 2 is a distribution plot illustrating an erased cell threshold voltage distribution and a programmed cell threshold voltage distribution of a number of core cells of an exemplary dual bit memory array, together with over programmed bits.

FIG. 2 is a distribution plot 300 illustrating an erased cell threshold voltage distribution 350 and a programmed cell threshold voltage distribution 360, together with over programmed bits 370, of a number of core cells of an exemplary dual bit memory array. Note that in a dual bit flash array, the threshold voltage distributions are shifted to the right with respect to the stacked gate cell array distributions of FIG. 1. Therefore the threshold voltages of the dual bit cells are generally higher than corresponding stacked gate cells in both the erased and programmed states, respectively.

As was discussed, the tendency to over program bits 170 in the prior art stacked gate flash memory, was not as prevalent as that of the dual bit flash memory array. FIG. 2 shows the over programmed bits 370, not only extending from a higher starting voltage $V_T$PMAX (e.g., about 6 volts), but also extending by a larger percentage than the prior art stacked gate array, to a new over programmed bit threshold voltage $V_T$OVP. The net effect, the inventors have found, is a much higher $V_T$ which may extend, for example, to as much as 8 volts. Therefore, this characteristic predicates that the applied wordline characterization voltage should extend somewhat higher than the expected highest over programmed cell threshold voltage $V_T$OVP in order to make sure one is able to measure all the expected $V_T$'s. The gates of the high breakdown voltage transistor and wordline drive transistors should then be boosted with a charge pump voltage which is higher (e.g., about 3 to 4 volts) than the applied signal (e.g., about 10 volts), to ensure full conduction at all applied signal voltages.

In accordance with the invention, and the solutions to these problems, the inventors devised an exemplary system and method to apply a varying characterization signal operably through a high breakdown voltage transistor and wordline drive transistors, which are driven into saturation by a boosted gate voltage which is higher than the applied varying characterization signal, in a manner which provides for the determination of the $V_T$ of the core cells, through the comparison of the current conduction in a reference cell to that of the current conduction in a core cell produced by a varying characterization signal applied to the core cell gate.

Figure 3:
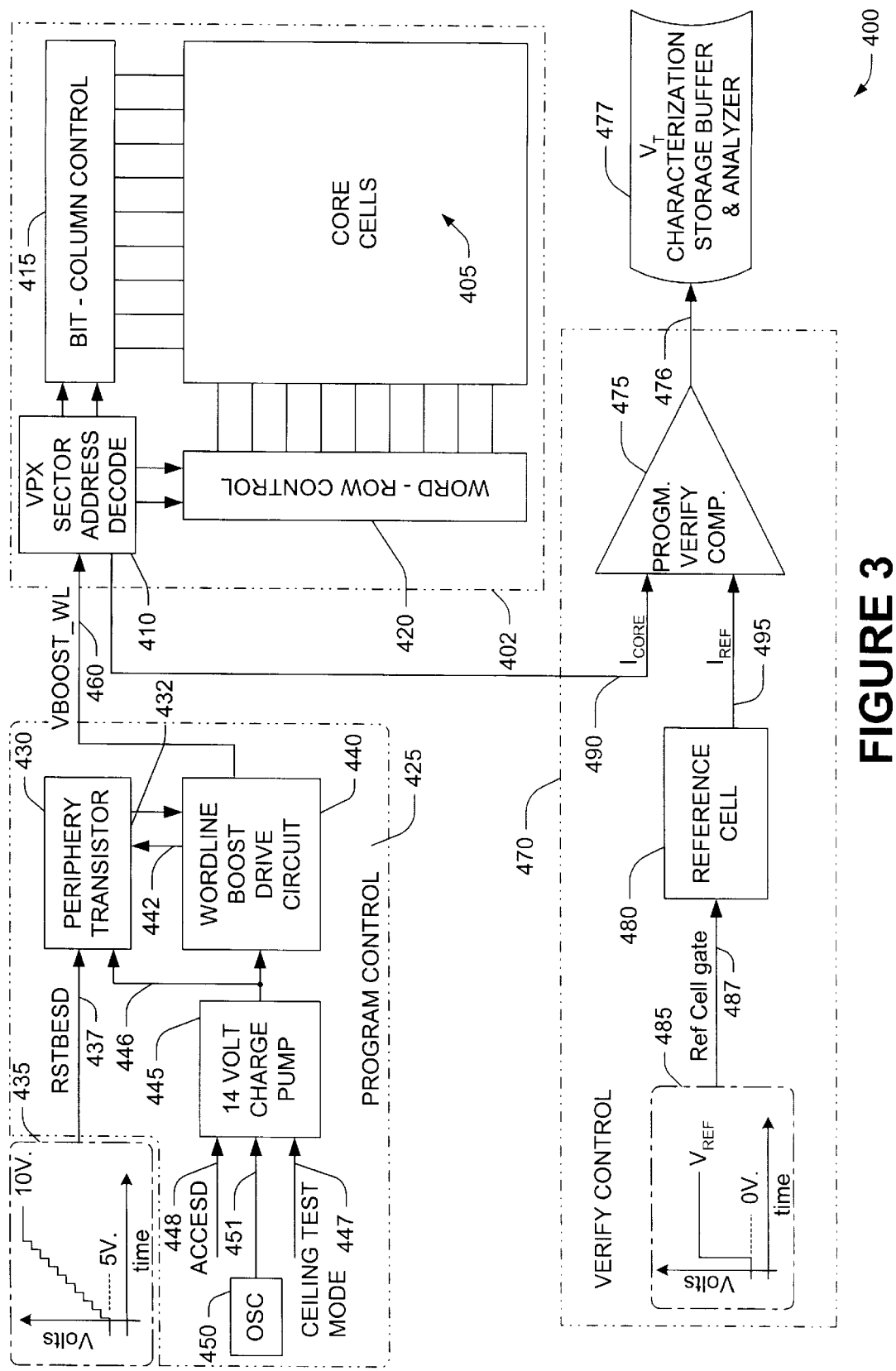
FIG. 3 is a system level functional block diagram illustrating an exemplary system for determining the threshold voltage of memory cells in which various aspects of the invention may be carried out.

The present invention may be understood and its advantages appreciated in FIG. 3, which illustrates a system level functional block diagram 400 of an exemplary system for determining the threshold voltage of memory cells 405. For example, the system 400 of FIG. 3 provides an accurate determination of the threshold voltage of a flash memory core cell by the application of a varying core cell characterization signal 435 applied to the core cell gate wordline 460.

The system 400 of FIG. 3, in accordance with the invention, comprises three exemplary functional blocks of Ceiling Test mode system which operate together as follows: A Ceiling Test mode begins with a logic command at the CEILING TEST MODE terminal 447, wherein a voltage level (e.g., 10 volt) which is applied at the ACCESD terminal 448, is timed by the oscillator input at the OSC input 450 to the charge pump circuit 451 (e.g., a 14 volt charge pump circuit). The charge pump circuit 445 outputs a boosted voltage of 14 volts to drive the gates 446 of a high breakdown voltage periphery transistor 430, and the transistors of a wordline boost drive circuit 440 hard into saturation. The transistor 430 has a high breakdown voltage $V_{BV}$ to withstand the 14 volt gate voltage as well as any transients which may be externally applied along with a varying core cell characterization signal 435.

The varying core cell characterization signal 435, is then applied to the drain terminal of transistor circuit 430 at the RSTBESD terminal 437. In accordance with one aspect of the invention, with the transistor 430 and the drive boost transistor 440 now hard in saturation, the core cell characterization signal 435 is easily passed without a substantial voltage drop thru 432 and VBOOST_WL 460 to the array wordline, in a manner which provides for the accurate determination of the $V_T$ of the core cells, for example, through the comparison 475 of the conduction current 495 in a reference cell 480 to that of the conduction current 490 in a core cell 405 produced by the varying characterization signal 435 applied to the core cell gate 460. Where it is found in the comparison 475 that the cell threshold voltage has been determined, the $V_T$ data is stored in a memory buffer or output to a peripheral device for use as desired.

A flash memory array system 402 of FIG. 3, includes an array of core cells 405 which are typically subdivided into sectors, blocks, and individual core cells. The cells are arranged in rows and columns, with all of the cells in a row having their control gate connected to a common word line. All the cells of the array have their sources coupled to a common source line, while the drains of the cells located in a particular column are all connected to a common bitline to enable the measurement of drain current in the core cells $I_{CORE}$ at 490. The memory system 402, also has address controls 410 which acts as a matrix of multiplexors working in conjunction with bit-column controls 415 and wordrow controls 420 used to select a sector, block, or individual cells of the core 405. The row control block 420 is connected to the word lines of the cells of the array and a column control block 415 is connected to the bit lines of the array. In operation, individual flash cells may be individually addressed via the respective bit line and word line using peripheral decoder and control circuitry for programming (writing), reading or erasing functions. These flash core cells 405 will be the object of the threshold voltage determination operations of the present invention, and discussed in greater detail in the following sections.

A program control circuit 425 according to one exemplary aspect of the present invention of FIG. 3, is configured with a high breakdown voltage periphery transistor 430 which conducts an externally or internally applied core cell characterization signal 435 via the RSTBESD input 437 through 432 to a wordline boost drive circuit 440, containing drive transistors which are driven into saturation by a boosted gate voltage 446, produced by a charge pump circuit 445. The charge pump circuit 445 is enabled by the CEILING TEST MODE input 447 and the ACCESD mode input 448, and timed by the oscillator 450 at the OSC input 451. The wordline boost drive circuit 440 is therefore enabled to substantially directly conduct the core cell characterization signal 435 through the output signal VBOOST_WL at 460.

A verify control circuit 470 according to one exemplary aspect of the present invention of FIG. 3, is configured with a reference cell 480 which uses $V_{REF}$, the reference cell reference voltage 485 and input 487 to the gate of the reference cell, to generate the reference cell current ($I_{REF}$) at 495. The verify control circuit 470 further includes a read verify comparator circuit 475 which is configured to compare the programmed core cell verification current ($I_{CORE}$) at 490 to the reference cell current ($I_{REF}$) at 495 to generate an output indication 476 of whether the selected programmed core cell threshold voltage $V_T$ is equal to a predetermined level on the core cell characterization signal 435.

The program verify comparator circuit 475 is further operable to transfer the $V_T$ indication 476 to an external or internal $V_T$ characterization storage buffer and analyzer 477 which is operable to store all threshold voltage indications of the entire array of core cells, and to analyze the data based on the indications. The goals and purposes of this analysis may, for example, be employed for subsequent feedback control operations, or for modification to the read, program, erase, soft program or associated verify operations of the same, as shown in an exemplary alternative system of FIG. 4.

Figure 4:
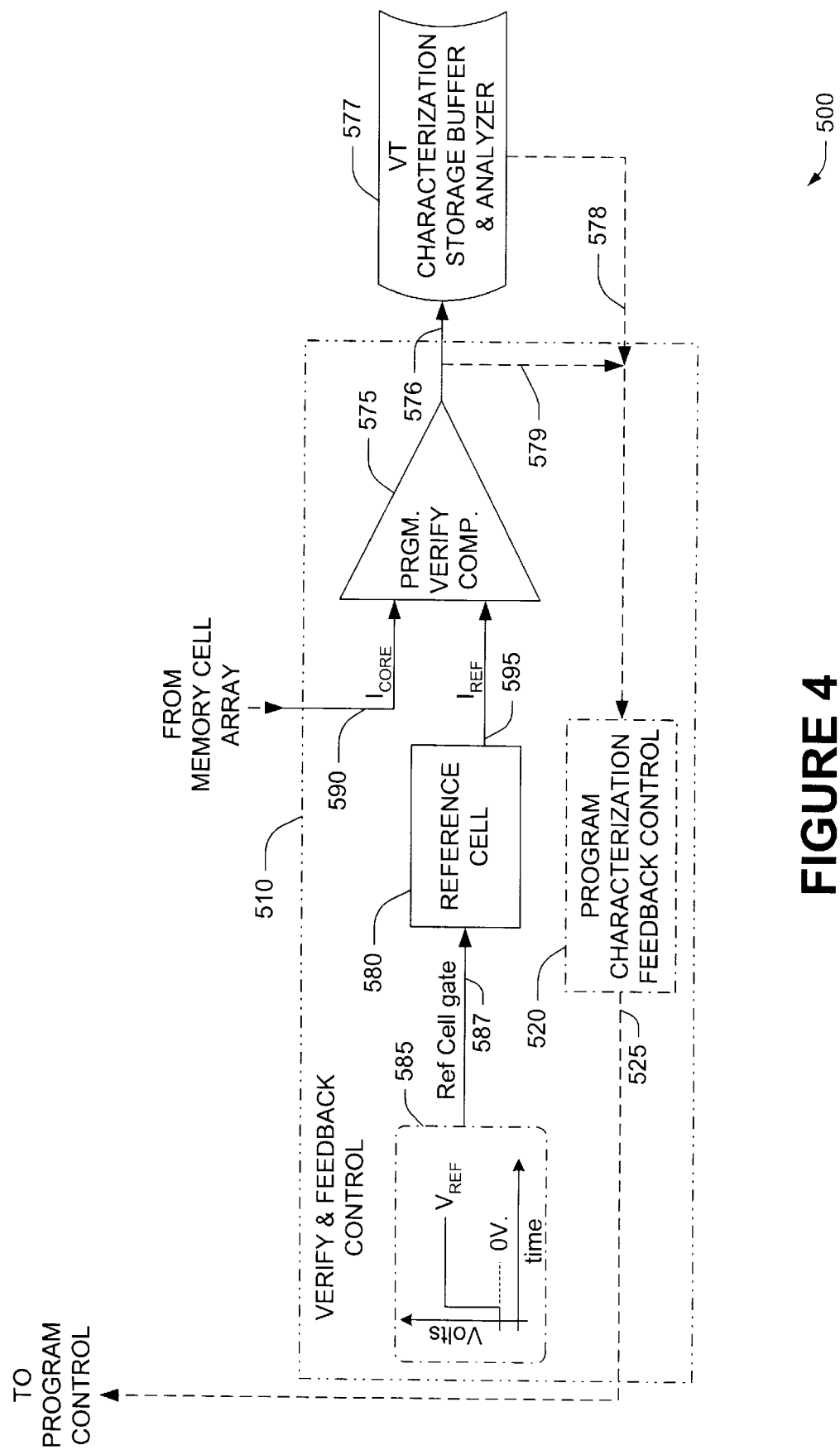
FIG. 4 is a functional block diagram of an alternative verify control circuit in the system of FIG. 3 with the addition of an optional program characterization circuit for providing feedback control.

FIG. 4 illustrates a functional block diagram 500 of an alternative aspect of the verify control circuit 470 in the system of FIG. 3 with the addition of an optional program characterization circuit 520 for providing feedback control of the $V_T$ indication back to the program control circuit 425.

During operation, for example, in the alternative verify and feedback control circuit 510 of FIG. 4, when a comparator 575 has made the determination that the selected core cell $V_T$ is equal to a predetermined level on the core cell characterization signal 435, comparator 575 provides a signal 579, or the $V_T$ indication storage and analysis operation of 577 may provide a signal 578 to initiate a predetermined program pulse from the program characterization feedback control circuit 520 via 525 back to the program control circuit 425.

Alternately, according to another aspect of the present invention, the differential current in a sense amplifier (e.g., differential amplifier) at 575, may be used to provide an output indication 576 or 579 used to anticipate the next desired input level on the core cell characterization signal 435, either in the analyzer 577, or the feedback control circuit 520, which could then be input to the wordline via the program control circuit 425 to speed up the overall verify process, or to minimize the effects of over programming, by discontinuing the program pulses at the optimum time. To accomplish this, the sense amplifier 575 output, would pass to either the analyzer 577, or the feedback control circuit 520, to convert the differential current into a signal conveyed thru the program control circuit 425 into some combination of proportional pulse width, or pulse height modulation of the program pulse.

In another variation of the present invention, there is provided a system and method to custom tailor a subsequent programming pulse (e.g., pulse width, pulse height) through the use of a look-up table located in a portion of the core memory array 405, or in a separate memory, wherein the differential current produced at 575 may be bracketed into two or more levels which would result in the selection of an appropriate optimized pulse width/height modulation of the programming pulse. Yet another variation and aspect of the invention is provided by the method, wherein the flash memory array as a whole is selected, and the differential current produced at 575 may be used to generate some combination of proportional pulse width, or pulse height modulation of the program pulse, or a whole series of pulses as a pulse string which is thereby tailored to the flash memory array as a whole for subsequent program operations to avoid or minimize subsequent over programming of flash cells.

Figure 5:
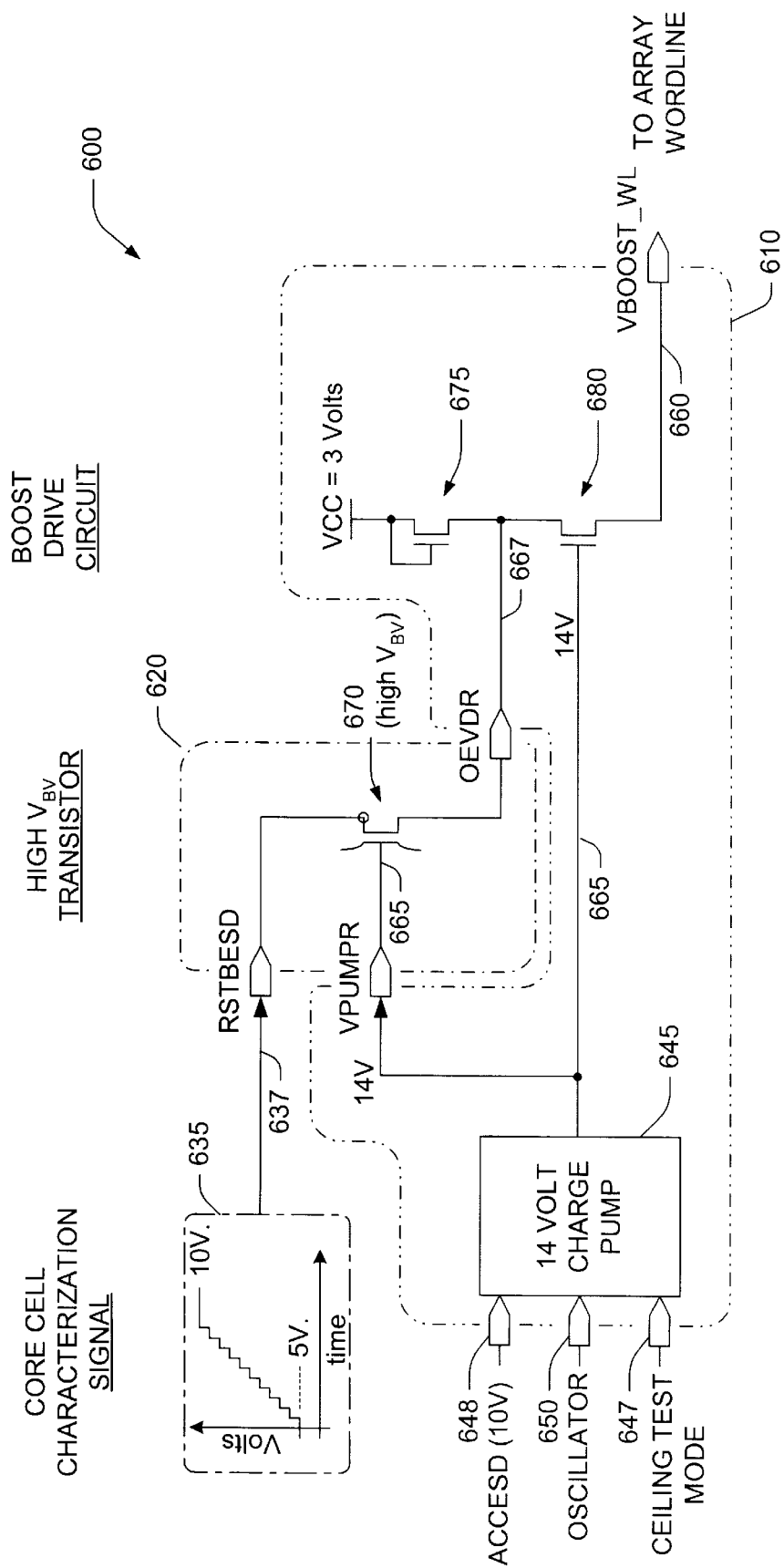
FIG. 5 is a schematic diagram illustrating an exemplary program control circuit, comprising a periphery transistor, a charge pump circuit, and a drive boost circuit with wordline drive transistor circuitry of the system of FIG. 3.

FIG. 5 is a schematic diagram illustrating an exemplary program control circuit 600, comprising a periphery transistor 620, and a drive boost circuit 610, comprising a charge pump circuit 645, and wordline drive transistor 680, of the program control circuit 425 of FIG. 3.

A Ceiling Test mode begins with a logic command at the CEILING TEST MODE terminal 647, wherein a voltage level (e.g., 10 volt) which is applied at the ACCESD terminal 648, is timed by the oscillator input at the OSC input 650 to the charge pump circuit 651 (e.g., a 14 volt charge pump circuit). The charge pump circuit 645 outputs a boosted voltage of 14 volts to drive the gates 665 of a high breakdown voltage transistor 670, and the boost drive circuit 610 transistor 680 hard into saturation. Transistor 675 is a diode clamp to the $V_{CC}$ to prevent node 667 from falling below $V_{CC}-V_{DIODE}$ thereby protecting the transistor junctions. The transistor 670 has a high breakdown voltage $VB_V$ to withstand the 14 volt gate voltage as well as any transients which may be externally applied along with the varying core cell characterization signal 635.

According to one exemplary aspect of the present invention, the high breakdown voltage characteristic of the transistor 670 is generated by forming a periphery donut-type guardring region around the transistor to increase the breakdown voltage rating thereof. Alternatively, or additionally, other mechanism may be employed to increase the breakdown voltage rating or provide additional protection, and such alternatives are contemplated as falling within the scope of the present invention.

The varying core cell characterization signal 635, is then applied to the transistor circuit 620 at the RSTBESD terminal 637 to feed the drain terminal of the transistor 670. In accordance with one aspect of the invention, with the transistor 670 and the drive boost transistor 680 now hard in saturation, the core cell characterization signal 635 is easily passed without appreciable voltage drop thru 667 and VBOOST_WL 660 to the array wordline, in a manner which provides for the accurate determination of the $V_T$ of the core cells, for example, through the comparison 475 of the conduction 495 in a reference cell 480 to that of the conduction 490 in a core cell 405 produced by a varying characterization signal 435 applied to the core cell gate 460.

Note, that according to one aspect of the present invention, the gate voltages of the high breakdown voltage transistor and boost drive transistors are significantly higher (e.g., 3 to 4 volts higher) than the applied varying characterization signal 435, to ensure full conduction of the characterization signal thru to the wordline without substantial voltage drops.

Figure 6:
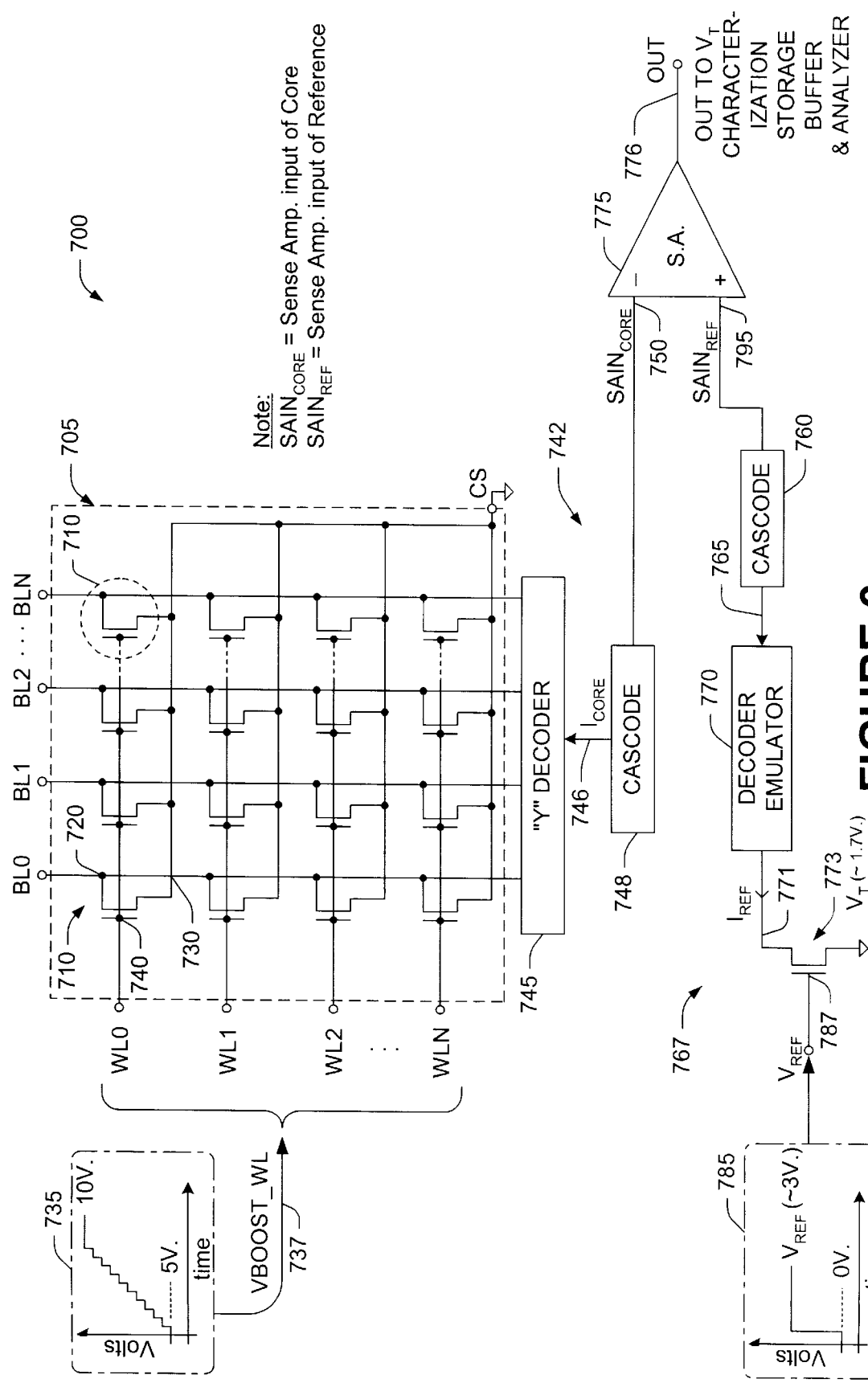
FIG. 6 is a schematic diagram of a circuit for determining the threshold voltage of memory cells according to one exemplary aspect of the present invention, with four exemplary bit and word lines of an array, based on a comparison of the core cell current and the reference cell current.

FIG. 6 depicts a simplified schematic diagram of one exemplary circuit 700 for carrying out the ceiling test in determination of the threshold voltage of memory cells 705. FIG. 6 illustrates the memory array 405, and the verify control 470 portions of FIG. 3. The same sense amplifier (comparator) is utilized as is used in normal read operations.

The memory cells within the core portion 705 are coupled together in, for example, a NOR-type circuit configuration, such as the configuration illustrated in FIG. 6. Each memory cell 710 has a drain 720, a source 730 and a gate region 740. The NOR configuration illustrated in FIG. 6 has each drain terminal 720 of the transistors within a single column connected to the same bit line (BL). In addition, each flash cell 710 has its gate terminal 740 coupled to a different word line (WL) while all the flash cells in the array have their source terminals 730 coupled to a common source terminal (CS). In operation, individual flash cells may be individually addressed via the respective bit line and word line using peripheral decoder and control circuitry for programming (writing), reading or erasing functions. It should be understood that a NAND array architecture may also be employed and is contemplated as falling within the scope of the present invention.

Four exemplary bit lines BL0–BLN are shown, with each bit line having four exemplary memory cells 710 connected thereto to form a simplified column control. Four exemplary word lines WL0–WLN are also shown, with each word line having four exemplary memory cells connected thereto to form a simplified row control. Decoder transistors used in conventional memory reading and programming are not shown.

Each memory cell of the array is connected to a common source terminal (CS) to ($V_{SS}$) ground. The current output of the memory cell 710 of the array 705, is selectively connected to the sense amplifier 775 in the form of a comparator by way of the memory cell drain lines 720 on the bit lines BL0–BLN through the "Y" decoder 745 via 746 and the cascode amplifier 748 coupling the core current $I_{CORE}$ to the inverting input 750 of the sense amplifier 775. The cascode (748, and 760) is a sensing amplifier, which translates bitline current into a differential amplifier input voltage. In normal operation, selected decoder lines are activated so that only the bitline and wordline of the array where the target cell 710 is located is connected to the core current output line 750.

An exemplary simplified reference cell 767 is shown comprising an n-channel transistor 773 with a known trimmed $V_T$ of about 1.7 volts. Normally this lower voltage reference cell would be classified as an Erase Verify reference cell, and a Verify reference cell having a $V_T$ of about 4.0 volts would be used to verify the programmed cells during memory program verify operations. For the Ceiling Test mode, however, this lower reference cell voltage, according to one aspect of the invention, is used to maintain an overdrive of about 15 volts so that the sensing is done around the range of 20 uA to 50 uA. When the Ceiling Test mode is enabled, a reference cell reference voltage ($V_{REF}$) 785 of about 3 volts, for example, is connected to the gate 787 of the Erase Verify reference cell 767, which is selectively coupled to the non-inverting input 795 of the sense amplifier 775, by way of the decoder 770 via 765 and through the current-to-voltage cascode amplifier 760. $V_{REF}$ 785 and the cascode amplifier 760 establish within the reference cell 767 a reference input $SAIN_{REF}$ 795 which may be used, for example, for input to the sense amplifier 775.

When the Ceiling Test is to be carried out, a word line is selectively connected to the varying core cell characterization signal 735 coupled through the VBOOST_WL wordline 737 and one or more of the target cell bit lines are connected to a positive voltage. In addition, the differential amplifier input voltage $SAIN_{CORE}$ 750 of the array 705 and a target cell, is connected to the inverting input 750 of the sense amplifier 775, and the reference differential amplifier input voltage $SAIN_{REF}$ is connected to the noninverting input 795 of the sense amplifier 775. As the varying core cell characterization signal 735 begins (e.g., at its lowest voltage) and the signal function varies (e.g., by way of a staircase, ramp, etc.), a point on the characterization signal will eventually be reached, whereby the sense amplifier will switch states, for example, from a 0 to a 1, providing an indication of current equality between the target core cell current $I_{CORE}$, and the known reference cell current $I_{REF}$. With the precise voltage point on the characterization signal now established wherein this current equality occurs, an indication of a corresponding threshold voltage of the core cell under analysis is then also established.

The $V_T$ indications 776 are output to a $V_T$ characterization storage buffer and analyzer which may save the indications for later use, for manufacturing improvements, for research, for statistical studies, or for any other informational uses where a more precise characterization of the cells programmed, or erased $V_T$ is desired. The $V_T$ indications may also be used for correctional purposes during manufacturing, such as installing or programming a means of program pulse compensation within the flash memory for further programming operations to bring the $V_T$'s together into tighter distribution profiles, or for on chip correctional and feedback purposes which could include means to generate some combination of proportional pulse width, or pulse height modulation of the program pulse, or a whole series of pulses as a pulse string which is thereby tailored to the flash memory array as a whole for subsequent program operations.

Figure 7:
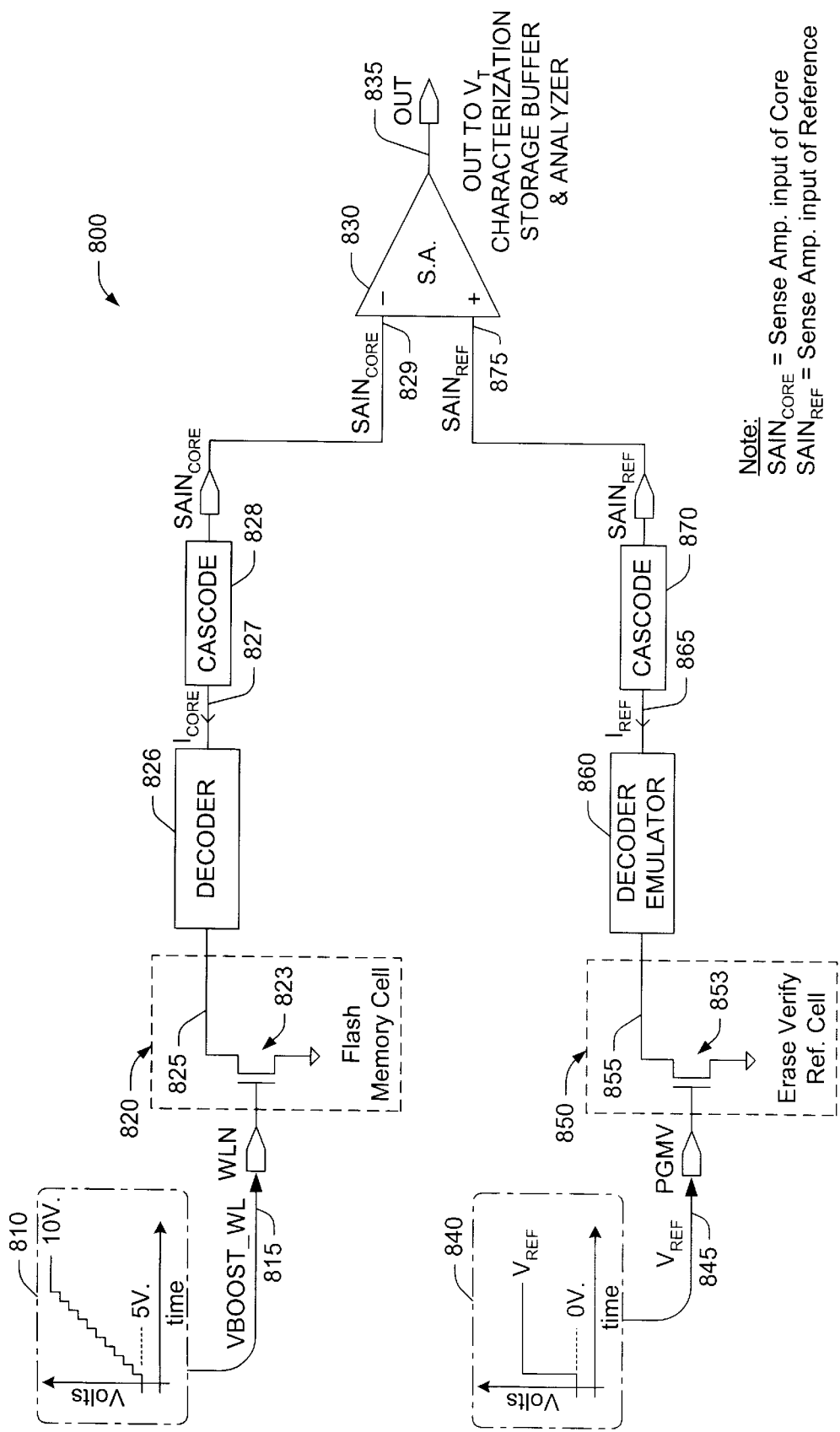
FIG. 7 is a schematic diagram illustrating an exemplary equivalent circuit for determining the threshold voltage of a memory cell, based on a comparison of the core cell current and the reference cell current.

FIG. 7 is a simplified schematic diagram of the system of FIG. 6, illustrating an exemplary equivalent circuit 800 for carrying out the Ceiling Test in determining the threshold voltage of a memory cell, based on a comparison of currents within an exemplary core cell 820 and an exemplary reference cell 850. FIG. 7, just as with FIG. 6, again depicts the memory array 405, and the program read verify control 470 portions of FIG. 3.

The exemplary memory cell 820 which is one target cell of an array, comprises an n-channel transistor 823 to establish (e.g., a current $I_{CORE}$, and a voltage $SAIN_{CORE}$), which is selectively connected by way of the memory cell drain lines 825 on the bit lines BL0–BLN through the "Y" decoder 826 via 827 and the current-to-voltage cascode amplifier 828, to the inverting input 829 of the sense amplifier 830.

The exemplary reference cell 850 is shown comprising an n-channel reference core cell 853 with a known trimmed $V_T$ of about 1.7 volts to establish (e.g., a current $I_{REF}$, or a voltage $V_{REF}$), which is selectively coupled by way of the decoder 860 via 865 and through the current-to-voltage cascode amplifier 870 to the noninverting input 875 of the sense amplifier 830.

When the Ceiling Test is to be carried out, the target core cell word line WLN is connected to the varying core cell characterization signal 810 coupled through the VBOOST_WL wordline 815 and the target cell bit line is connected to a positive voltage via the cascode amplifier 828. In addition, the output current $I_{CORE}$ of the array target cell 820, is connected to the inverting input 829 of the sense amplifier 830, and the reference cell current $I_{REF}$ is connected to the noninverting input 875 of the sense amplifier 830. As the varying core cell characterization signal function 810 varies, a point on the characterization signal will eventually be reached, whereby the sense amplifier will switch states, providing an indication of current equality between the target core cell current $I_{CORE}$, and the known reference cell current $I_{REF}$. With the precise voltage point on the characterization signal established, an indication of a corresponding threshold voltage is established. The $V_T$ indications 835 are then output to a $V_T$ characterization storage buffer and analyzer which may save the indications for any use wherein a more precise characterization of a cell $V_T$ is desired.

Figure 8:
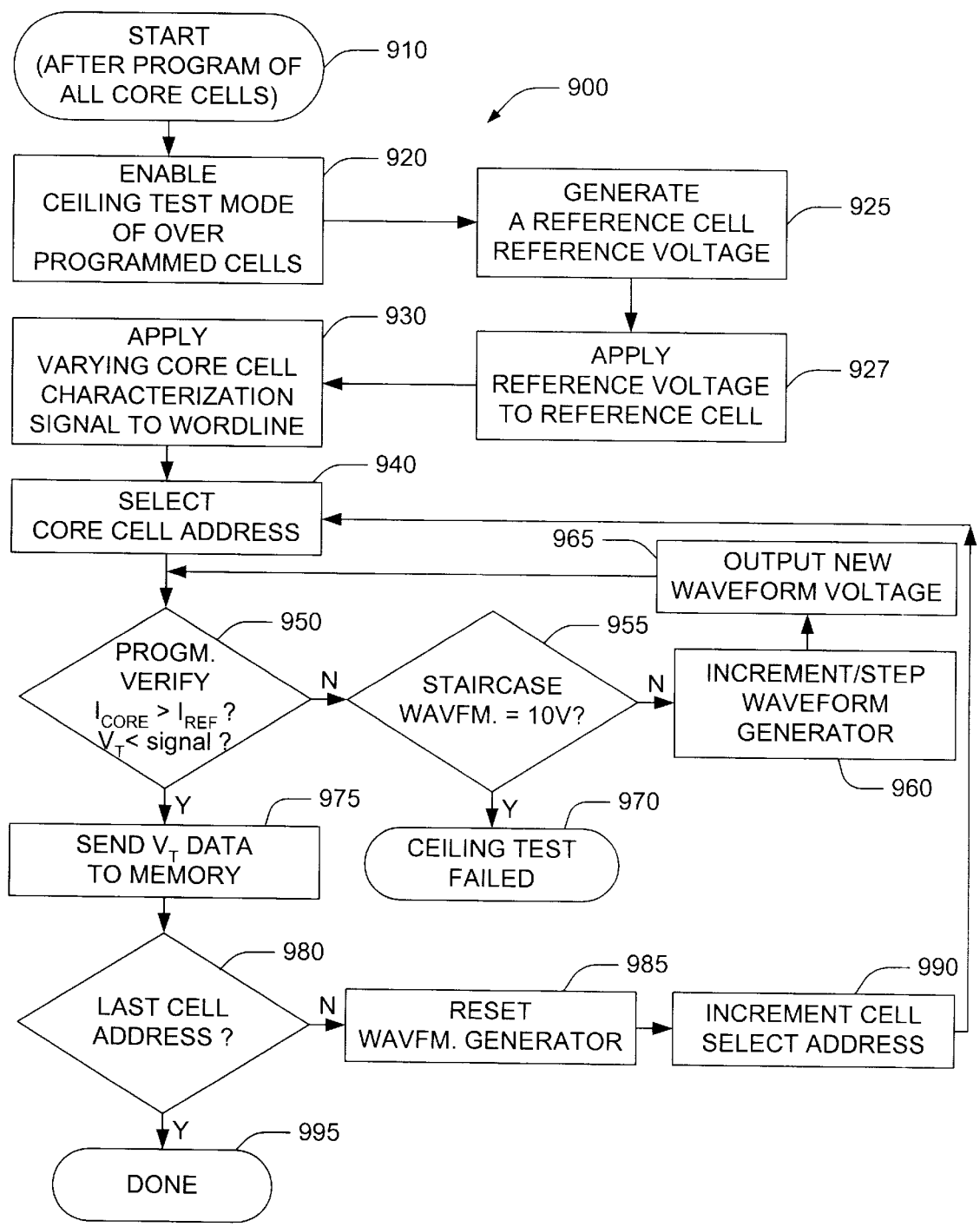
FIG. 8 is a flow diagram illustrating an exemplary method for determining the threshold voltage of a memory cell according to the invention.

FIG. 8 is a flow diagram illustrating an exemplary method 900 for determining the threshold voltage of a memory cell according to the invention, and will be discussed in conjunction with the exemplary system of FIG. 3 for purposes of explanation. For example, once a program operation has been performed to program the data bits of a sector of memory (e.g., by writing a 0 value thereto), the method 900 begins at step 910, after which the Ceiling Test mode of over programmed cells is enabled at step 920, which also comprises a step of initializing a core cell address to a first address.

While for purposes of simplicity of explanation, the methodology of FIG. 8 is shown and described as a series of steps, it is to be understood and appreciated that the present invention is not limited by the order of the step, as some steps may occur in different orders and/or concurrently with other steps from that described and shown herein. Moreover, not all illustrated steps may be required to implement a methodology in accordance with an aspect of the invention.

The method 900 proceeds to step 925, whereat a reference cell voltage is generated for the reference cell. At step 927, the generated reference voltage of step 925 is applied to the reference cell to produce a reference current conducting therethrough. After step 927, a varying core cell characterization signal is applied, in step 930, to a wordline, for example, via a high breakdown voltage pass transistor within the program control circuit which is operably coupled to the core cell wordline. Following step 930, the first cell address is selected at step 940. The first memory cell is then program verified for an over programmed cell condition at step 950. At decision step 950, a determination is made as to whether a core cell has been programmed.

As illustrated and described in greater detail hereinafter with respect to FIG. 3, the program verification operations performed at steps 950 and 960 of the method 900, may be carried out via the application of a varying core cell characterization signal to the selected core cell gate, and the application of a reference voltage to the reference cell gate (e.g., about 3 volts), and then comparing the two currents, and making a determination based on that comparison whether the associated programmed core cell threshold voltage is less than the varying core cell characterization signal voltage at the particular point on the signal being examined. If, for example, this characterization signal has a lowest voltage point of 5 volts for over program comparison, then the comparison will also determine whether the associated programmed core cell threshold voltage is less than 5 volts.

If, for example, at step 950 the selected core cell current is less than the reference cell current, a determination is made that the core cell has a threshold voltage which is greater than 5 volts (e.g., the cell has been programmed), and the method 900 proceeds to step 955, whereat a voltage check may be performed of the present voltage applied to the core cell in the attempt to determine the magnitude of the over programmed cell threshold voltage. If a predetermined voltage $V_T OVP$ (e.g., 10 volts) has been exceeded, a determination may be made at step 955 to identify the core cell as having failed the Ceiling Test mode and proceeds to step 970. In this manner, the core cell will not be subjected to excessive voltages of the varying core cell characterization signal without being re-erased; the program will not hang in a never ending loop, should a selected cell be defective; and it may be desirable to apply some methods discussed of over programmed cell correction, or feedback. If, however in step 955, a predetermined voltage has not exceeded $V_T OVP$, the method 900 proceeds to step 960, whereat the present voltage is for example, stepped, incremented, or otherwise increased so as to select another varied voltage on the characterization signal according to the voltage resolution desired.

After step 960, method 900 continues to step 965 for the output of the new voltage level on the characterization signal waveform applied to core cell, and a return to step 950 for another program verification for an over programmed cell condition. Where it is found at decision step 950 that the cell threshold voltage has been determined, the $V_T$ data is stored in a memory 975 or output to a peripheral device, and the method 900 proceeds to step 980, whereat it is determined whether the last cell address has been reached (e.g., in a given cell memory block or sector, or in a given multiple cell memory block or sector). For example, the method may be selectively employed to verify the program of a certain number of the cells (e.g., a byte (8 bits), a word (16 bits)), which are connected in a NOR configuration, although other implementations are possible wherein any number of such cells may be serially verified according to the invention.

If the last cell address has not been reached at decision step 980, the method proceeds to step 985, whereat a varying core cell characterization signal may be reset to, for example, to a lowest voltage, prior to proceeding to step 990. At step 990 the current address is incremented before proceeding to step 940 again, whereat the next cell address is selected as before. Otherwise (e.g., all such cells have been verified), the method 900 ends at step 995.

It will be appreciated in this regard, that the method 900 may include internal varying core cell characterization waveform generators or other steps by which a cell may be determined to be unuseable (e.g., unable to be properly programmed) after a maximum predetermined characterization voltage is reached attempting to perform a program verification, whereby the cell (e.g., or a number of related cells, such as a byte or word) may be marked as bad, or the part itself may hang as part of a failed sector erase operation. Further in this regard, if the method 900 is employed in a manufacturing process (e.g., before or after packaging, but before shipment to a customer), redundancy may be employed to mark a cell or a number of cells as bad, and to provide alternate or redundant storage cells as a replacement, whereby acceptable manufacturing yield may be achieved. The method 900 may also be employed in association with a sector or chip program verification operation initiated by an end-user, wherein a cell failure may be indicated to the user via the memory device hanging as a result.

Thus, a novel memory system capable of providing a precise indication of the threshold voltage of a core cell and related method have been disclosed.

Other variants of methodologies may be provided in accordance with the present invention, whereby the threshold voltage of a core cell is determined. By way of example, reference has been made to an array of cells, but the term array should be interpreted to include one segment of a memory system of cells which includes multiple cell segments. Conversely, where a single memory cell, or "cell" is referenced, the term should be interpreted to mean "one or more cells", including a complete array of memory cells.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A method of determining a threshold voltage of a flash memory cell, comprising the steps of:

generating a reference cell reference voltage;

applying the reference cell reference voltage to a gate portion of a reference cell, thereby generating a reference cell current conducting therethrough;

applying a varying core cell characterization signal to a gate portion of a core flash memory cell, thereby generating a core cell current conducting therethrough; and determining whether a threshold voltage associated with the flash memory core cell is equal to a predetermined level on the varying core cell characterization signal, based on a comparison of the core cell current and the reference cell current, and at which voltage on the varying characterization signal the comparison transition occurs, and subsequently storing the threshold voltage data to memory.

2. The method of claim 1, further comprising the step of discontinuing core cell programming if the determination indicates that a programmed core cell has a threshold voltage above a predetermined threshold.

3. The method of claim 1, wherein the varying core cell characterization signal is generated within the flash memory device.

4. A method of determining a threshold voltage associated with a programmed dual bit flash memory cell, comprising the steps of:
(a) applying a characterization voltage signal on a gate terminal of the programmed dual bit flash memory cell;
(b) varying the applied characterization voltage signal over a predetermined range;
(c) evaluating a conduction current associated with the programmed dual bit flash memory cell for each of the applied characterization voltage signals over the predetermined range; and
(d) determining the threshold voltage based on the evaluation.

5. The method of claim 4, wherein applying the characterization voltage signal on the gate terminal of the programmed dual bit flash memory cell comprises:
generating a boosted voltage having a magnitude which is substantially greater than a highest expected threshold voltage value; and
applying the boosted voltage to a gate terminal of a pass transistor operable to pass the applied characterization voltage signal to the programmed dual bit flash memory cell, wherein the boosted voltage places the pass transistor into a saturation condition, thereby minimizing a voltage drop thereacross, experienced by the applied characterization voltage signal.

6. The method of claim 5, wherein the pass transistor comprises a high breakdown voltage transistor, wherein the boosted voltage applied thereto does not cause damage thereto.

7. The method of claim 4, wherein the applied characterization voltage signal comprises a voltage value less than a lowest expected programmed dual bit flash memory cell threshold voltage.

8. The method of claim 7, wherein varying the applied characterization voltage signal over the predetermined range comprises increasing the applied characterization voltage signal from the voltage value less than the lowest expected programmed dual bit flash memory cell threshold voltage to a voltage value greater than a highest expected programmed dual bit flash memory cell threshold voltage.

9. The method of claim 8, wherein the voltage value less than the lowest expected programmed dual bit flash memory cell threshold voltage is about 5 volts, and the voltage value greater than the highest expected programmed dual bit flash memory cell threshold voltage is about 10 volts.

10. The method of claim 4, further comprising:
repeating steps (a)–(c) for a plurality of programmed dual bit flash memory cells;
storing the determined threshold voltage associated with each of the plurality of programmed dual bit flash memory cells in a memory, wherein the plurality of threshold voltages comprise a threshold voltage distribution;
generating modification data associated with the threshold voltage distribution.

11. The method of claim 10, further comprising modulating a subsequent programming pulse based on the generated modification data to thereby reduce an amount of over programming of dual bit flash memory cells.

12. The method of claim 11, wherein modulating the programming pulse comprises modifying a duration of the programming pulse or an amplitude associated therewith.

13. A system for determining a threshold voltage of a flash memory cell, comprising:
a program control circuit configured to conduct therethrough a varying core cell characterization signal to the gate portion of a core cell;
a flash memory array of core cells operably coupled to core address control circuitry, bit/column control circuitry and word/row control circuitry, wherein the flash memory array is operable to generate a core cell characterization current for a selected core cell having the core cell characterization signal applied thereto; and
a program verify control circuit configured to generate a reference cell reference voltage, which is coupled to the gate of a reference cell operable to generate a reference cell current using the reference cell reference voltage, and compare the core cell characterization current to the reference cell current and provide a comparison indication associated therewith, wherein a change in the comparison indication provides information related to the threshold voltage of the selected core cell.

14. The system of claim 13, wherein the program control circuit is further operable to generate the varying core cell characterization signal.

15. The system of claim 13, wherein the program verify control circuit further comprises:
a program characterization feedback control circuit configured to generate a program control signal operably coupled thru the program control circuit to modify a programming pulse applied to a core cell based on the threshold voltage determination, or a threshold voltage characterization analysis of a plurality of programmed flash memory cells.

16. The system of claim 13, wherein the program control circuit further comprises a transistor exhibiting a high breakdown voltage characteristic operable to conduct the varying core cell characterization signal therethrough to the core cell.

17. The system of claim 16, wherein the program control circuit further comprises a charge pump operable to generate a boosted charge pump voltage to a gate of the high breakdown voltage transistor, thereby forcing the transistor into a state of saturated conduction, thereby allowing the varying core cell characterization signal to be conducted therethrough to the core cell without a substantial voltage drop thereacross.

* * * * *

UNITED STATES PATENT AND TRADEMARK OFFICE
CERTIFICATE OF CORRECTION

| | | |
|---|---|---|
| PATENT NO. | : 6,370,061 B1 | |
| DATED | : April 9, 2002 | |
| INVENTOR(S) | : Santosh K. Yachareni, Kazuhiro Kurihara, Binh Q. Le and Michael S. C. Chung | |

It is certified that error appears in the above-identified patent and that said Letters Patent is hereby corrected as shown below:

<u>Column 7,</u>
Line 60, please replace the word "$VB_V$" with the word -- $V_{BV}$ --.

Signed and Sealed this

Fourth Day of June, 2002

*Attest:*

*Attesting Officer*

JAMES E. ROGAN
*Director of the United States Patent and Trademark Office*